United States Patent [19]

Osada et al.

[11] Patent Number: 5,435,953
[45] Date of Patent: Jul. 25, 1995

[54] METHOD OF MOLDING RESIN FOR SEALING AN ELECTRONIC DEVICE

[75] Inventors: Michio Osada; Yoshihisa Kawamoto, both of Kyoto, Japan

[73] Assignee: Towa Corporation, Uji, Japan

[21] Appl. No.: 173,150

[22] Filed: Dec. 21, 1993

Related U.S. Application Data

[63] Continuation of Ser. No. 819,451, Jan. 10, 1992, abandoned.

[30] Foreign Application Priority Data

Jan. 17, 1991 [JP] Japan .................................. 3-018352
May 28, 1991 [JP] Japan .................................. 3-155719
Jun. 10, 1991 [JP] Japan .................................. 3-166501

[51] Int. Cl.⁶ ...................... B29C 45/02; B29C 45/63; B29C 45/72
[52] U.S. Cl. .............................. 264/102; 264/272.14; 264/272.17; 264/328.5; 425/129.1; 425/544; 425/420
[58] Field of Search ..................... 264/272.17, 272.14, 264/102, 328.5; 425/420, 812, 129.1, 544, 546

[56] References Cited

U.S. PATENT DOCUMENTS 4,793,785 12/1988 Osada .
5,059,373 10/1991 Hirabayashi .................... 264/272.17
5,082,615 1/1992 Sakai .............................. 264/272.17

FOREIGN PATENT DOCUMENTS 0096132 12/1983 European Pat. Off. .
2532242 3/1984 France .
60-132716 7/1985 Japan .
60-251633 12/1985 Japan ............................... 264/328.5
60-251635 12/1985 Japan .
61-85830 5/1986 Japan .
62-282440 12/1987 Japan .
63-007638 1/1988 Japan .
2126155 3/1984 United Kingdom .

Primary Examiner—Jan H. Silbaugh
Assistant Examiner—Angela Ortiz
Attorney, Agent, or Firm—W. G. Fasse; W. F. Fasse

[57] ABSTRACT

In a method for molding resin to seal an electronic part, a sealed space portion is formed between molding surfaces of an upper mold section and a lower mold section by covering an outer side periphery of a pot, a resin path and a cavity. A resin tablet is heated at its bottom portion and peripheral portion in the pot of the lower mold section to expand upwardly from its top portion. Air and moisture included inside the resin tablet is expelled into the sealed space portion which is evacuated including any air and moisture inside the sealed space portion, whereby the formation of voids in the molded resin body is avoided.

12 Claims, 14 Drawing Sheets

METHOD OF MOLDING RESIN FOR SEALING AN ELECTRONIC DEVICE

This application is a continuation of application Ser. No. 07/819,451, filed on Jan. 10, 1992, now abandoned.

FIELD OF THE INVENTION

The present invention relates to an improvement of a method of molding resin for sealing electronic parts such as ICs, LSIs, diodes, capacitors and so forth, for example, and particularly to preventing the formation of any voids inside or outside of a molded resin sealing body, also referred to as a mold package, of electronic parts.

BACKGROUND INFORMATION

The transfer mold method has been conventionally introduced as a method of molding resin to seal electronic parts. This method is usually performed as described below using a mold for the resin molding according to a first conventional example as shown in FIGS. 1 and 2.

A stationary upper mold 51 and a movable lower mold 52 are preheated to a predetermined resin molding temperature by a heater 64 while the upper and lower molds 51 and 52 are opened as shown in FIG. 1.

Next a lead frame 62 to which an electronic part 63 is attached is fittingly set in a predetermined position in a concave portion 61 provided in a molding surface of the lower mold 52, and a resin tablet 67 is supplied into a pot 53.

Next, the lower mold 52 is moved upwards to close the upper and lower molds 51 and 52 as shown in FIG. 2. At this time, the electronic part 63 and the lead frame around it are fittingly set inside upper and lower mold cavities 55 and 56 oppositely formed in both of the molding surfaces, and the resin tablet 67 inside the pot 53 is heated to gradually melt.

Next, the resin tablet 67 inside the pot 53 is pressurized by a plunger 54. Then, the melted resin material is injected into both cavities 55 and 56 through a resin path 57 provided between the pot 53 and the upper mold cavity 55. Then, the electronic part 63 and the lead frame 62 carrying part 63 are sealed in the resin sealing body molded corresponding to the shape of both cavities 55, 56. Accordingly, after a time required for hardening of the melted resin material has passed, the hardened molded resin body, the lead frame 62, and the hardened resin inside the resin path are respectively separated from the molds by ejector pins 65 simultaneously with opening the upper and lower molds.

Air exists inside a space formed between the molding surfaces when the upper and lower molds 51 and 52 are closed, that is, a space in the molds including the pot 53, the resin path 57 and the upper and lower cavities 55 and 56. Accordingly, it has been a problem in such conventional resin molding that voids or defective portions are formed inside or on the surface of a molded resin body because the remaining air mixes into the melted resin material. Accordingly, said space is configured so that remaining air can be naturally pushed out through an air vent 58 utilizing the effects of transmitting, ejecting and filling the melt resin material inside the pot 53 through resin path 57 into the upper and lower cavities 55 and 56 by communicating the above-mentioned mold space namely the cavity 55 to the outside of the mold and the appropriate air vent 58.

As described above, the air existing in pot 53, resin path 57 and both of the cavities 55 and 56 can be naturally pushed out from air vent 58. Actually, however, especially the formation of inner voids in molded resin bodies and the like cannot be effectively prevented. Accordingly, the problems of damaging the humidity resistance and appearance of products produced as described above have not been completely solved in practice.

In order to avoid formation of voids inside molded resin bodies, the following further improved methods are possibilities. For example, by applying a predetermined resin pressure to a melted resin material injected to fill both cavities 55 and 56, the bubbles which entered into the melted resin material are compressed to a neglectable degree for implementing conditions under which inner voids are not apparently formed. In said further method, however, although the advantage of void removal can be realized to some extent, problems are caused by the fact that apparatus, mechanisms and the like with a high lasting quality are necessary for applying a high resin pressure and furthermore that the work is risky.

The air existing in pot 53, resin path 57 and both cavities 55 and 56 is forced to be exhausted to the atmosphere, to prevent the air from contaminating the melted resin material. Such a method is excellent in that the air does not easily mix into the melted resin material since the air existing in the pot, the resin path and both cavities is exhausted. As compared to the conventional method of naturally exhausting the air to the atmosphere, the formation of inner voids in molded resin bodies can be prevented more effectively by resin pressure. However, despite that the formation of inner voids can be effectively avoided, the forced exhaustion method is not actually applied or practiced as a method of molding resin seals for electronic parts. Even if the above method is applied in practice, the effects as described above cannot be obtained actually.

Also, when the seal molding operation for sealing of electronic parts with resin molding is not surely performed, or when the condition of contact between the molded resin body and the lead frame of the electronic parts is insufficient, the humidity resistance of products is also degraded similarly to the above-described case where voids are formed in molded resin bodies. Furthermore, for example, in the working process of bending an outer lead protruding from a molded resin body, cracks may be produced in the molded resin body due to the bending work force applied to a base portion of the outer lead, or the portion might be broken. Accordingly, because of disadvantages such as those mentioned above, it is a serious problem that the high quality and high reliability strongly demanded for this kind of products cannot be obtained.

Next, a second conventional example of a method of molding a resin seal of electronic parts according to the transfer mold method and apparatus thereof will be described referring to FIGS. 3 and 4.

The conventional apparatus shown in FIGS. 3 and 4 uses a multi-plunger type system and is described below whereby reference is made to U.S. Pat. No. 4,793,785 (Osada), issued Dec. 27, 1988.

The known apparatus includes a stationary mold 1 and a movable mold 2 disposed below and opposed to the mold 1. These molds 1 and 2 include bases 3 and 4, respectively, which are provided with heating means 5 and 6 such as oil heaters, electric heaters or the like.

The stationary mold base 3 and the movable mold-base 4 are respectively provided with a stationary chase block 7 and a movable chase block 8 movably fitted therein by a mortise joint.

The movable chase block 8 has a plurality of pots 9 each of which is provided with a pair of right and left lower cavities 10 in the vicinity thereof. A heater heats the lower cavity 10. Disposed below the chase block 8 is a lower ejector plate 12 having ejector pins 12a for ejecting resin bodies molded in the lower cavities 10, and a plunger holder 13 supporting thereon plungers 13a for applying a pressure to the resin material supplied to the pots 9. The ejector pins 12a are fittingly inserted in bores 14 extending through the chase block 8 and communicating with the lower cavities 10. Each plunger 13a is inserted through bores 15, 16 formed in the movable mold base 4 and the ejector plate 12, respectively, and fitted in the pot 9. The tenon 8a of the chase block 8 has at least one vertical screw hole not shown. When the tenon 8a is fitted in the mortise 4a to install the chase block 8 in the base 4, the screw hole is in register with a vertical bolt hole 18 formed in the base. Accordingly, the block 8 can be properly fixed in position to the base 4 by screwing a positioning bolt 19 into the screw hole 17 through the bolt hole 18.

The stationary chase block 7 has a pair of right and left upper cavities opposed to each pair of lower cavities 10. A heater 6, is provided in the vicinity of the upper cavities. Disposed above the chase block 7 are an upper ejector plate 22 having ejector pins 22a, a support pin 22b for the plate 22, and a spring 23 for depressing the plate 22 through the pin 22b. The ejector pins are fittingly inserted through vertical bores 25 formed in the block 7 and communicate with the upper cavities 20 or culls, not shown, opposed to the pots 9. The ejector plate 22 is depressed by the force of the spring 23 when the molds are opened, whereby the resin bodies molded in the upper cavities, the culls and gates, not shown, through which the cavities communicate with the culls, are ejected from the cavities.

At this time, the lower ejector plate 12 is pushed up by the ejector bar 12b which is fixed at a portion 12c located on the outer side of the movable mold 2, whereby the molded resin bodies in the lower cavities 10 are ejected. However, when the movable mold 2 is raised into clamping contact with the stationary mold 1 at the plane of their parting line P.L., upper and lower return pins, not shown, opposed to and mounted on the upper and lower ejector plates 22, 12, retract the plates 22, 12 upwardly and downwardly respectively.

The stationary cavity block 7 and the stationary mold base 3 have a tenon 7a and a mortise 3a which are the same as the tenon 8a and the mortise 4a of the movable chase block 8 and the movable mold block 4. A fixing device comprising a screw hole, a bolt hole, and a bolt identical with the above-mentioned device, is provided for fixing the movable chase block 8 to the movable mold base 3.

The movable chase block 8 is fittable into and removable from the base 4, for example, together with the lower ejector plate 12 when the plungers 13a are in a downwardly moved position.

The stationary chase block 7 is fittable into or removable from the base 3, for example, together with the upper ejector plate 22 after the support pin 22b has been removed from the plate 22.

The operation of sealing electronic parts with resin according to the second conventional example is almost the same as that of the above described first conventional example.

Inside and outside of the cavity described above, usually communicate with each other through an appropriate air vent and the air inside the cavity is naturally pushed out through the air vent through the effect of the resin injection and filling, when injecting to fill both of the cavities with the melted resin material.

The electronic part and the lead frame around it are encapsulated inside the resin body molded corresponding to the shape of both cavities. After the resin hardens, the lower mold is moved downward to open the upper and lower molds, and almost simultaneously, the molded resin body and the lead frame inside both cavities and the hardened resin inside the resin path are released by a releasing mechanism, respectively.

As described above with reference to the first conventional example, the remaining air existing in the pot, the resin path and both cavities is naturally exhausted outside through the air vent. Venting the remaining air, however, is a problem because the formation of voids in the molded resin bodies cannot be effectively prevented since the exhausting action is not satisfactory.

In order to solve the problem of the formation of voids in the molded resin bodies, for example, it is a possibility to exhaust the remaining air existing in a pot, a resin path, and both cavities by force using a vacuum source.

However, although exhausting with a vacuum source is excellent in that the above-mentioned remaining air inside the space of the mold structure is not easily mixed into the melt resin material, it is not actually put into practice because of the following technical problems.

That is to say, upper and lower molds of a mold for resin molding are opened and closed every time the resin is molded, and for using the above-stated vacuum source, it is necessary to seal by suitable seals at least the pot, the resin path, and cavity portion from the outside air when clamping both molds and exhaust the remaining air and moisture within the so enclosed space.

As the above-mentioned seals for example, the following are possibilities; O-rings are provided on the molding surfaces of both molds, which are depressed when closing the molds to exclude the outside air from the area defined thereby, or fitting concave and convex portions are oppositely provided on molding surfaces of both molds, which are fit to each other when closing the molds, and these O rings provided on fitting surfaces of the concave and convex portions are depressed to exclude the outside air from the area set thereby.

However, when providing outside air excluding seals such as O-rings and fitting concave and convex portions and so forth on molding surfaces of both molds, closing of both molds and the action of excluding the outside air by the outside air excluding vacuum source are performed almost simultaneously. Accordingly, even when an abnormality occurs, for example when a lead frame positioned on a mold surface is not set at a predetermined position or state due to some reasons, the mold closing action and the outside air excluding action are performed almost simultaneously, resulting in a problem that the molding surfaces of both molds, the lead frame and the outside air excluding seals may be damaged.

Also, if attempting to fix the outside air excluding seals on the molding surfaces of both molds, a problem is caused that the work of attaching and replacing the chase blocks on both of the molds is troublesome. Furthermore, if the chase blocks are often to be replaced due to the production of many kinds and small numbers of electronic parts, there is a problem that the total productivity is reduced because the chase block replacing work takes time and effort.

When supplying a resin tablet into a pot and melting the resin tablet by heating and pressurizing, for the purpose of aiding the thermally melting effect, the resin tablet is pre-heated before supplying the resin tablet into the pot.

Since a melted resin layer is formed on a surface of the pre-heated resin tablet, however, when supplying the same into the pot and applying heat for heating the molds, large amounts of air and moisture included inside the resin tablet cannot be extracted to the outside because it is prevented by the above-mentioned melted resin layer. Accordingly, a large amount of air and moisture mixes into the melted resin material whereby voids are formed on a surface portion and an inside portion of a molded resin body, which is a problem.

When sealing the area of the pot, the resin path and the cavity portion from the outside and exhausting the remaining air and moisture inside that area by a vacuum source when both molds are completely closed, the remaining air and moisture are exhausted to the atmosphere through an air vent formed of fine gaps provided between molding surfaces of both molds, because it is extremely difficult that the air and moisture go out from the contact surface of both molds, since surfaces of both molds are connected closely and strongly because of the demand in the resin molding of preventing occurrence of resin flash on both mold surfaces.

Accordingly, when both molds are completely closed, even if applying the above-described exhausting effect by a vacuum source, the efficiency of exhausting the remaining air and moisture existing between molding surfaces of both molds is inferior, resulting in a problem that a vacuum condition cannot be actually implemented inside the above-stated area.

SUMMARY OF THE INVENTION

It is a first object of the present invention to further improve the above-described method of forcing out air, to provide a method of molding a resin sealing of an electronic part capable of efficiently and surely preventing the formation of voids and defective portions inside and a surface portion of a molded resin body by completely preventing air from mixing into melted resin material which is heated and melted inside a pot by efficiently and surely exhausting air and moisture not only inside the pot, a resin path, and both cavities but also from inside the resin material such as a resin tablet.

It is a second object of the present invention to provide a method of molding a resin sealing of an electronic part efficiently and with certainty to a product having a high quality and a high reliability by enhancing the closeness between a molded resin body and a lead frame of an electronic part.

It is a third object of the present invention to simplify the total procedure and structure for forcing out the remaining air and moisture within a sealed area to enhance the workability and operability.

It is a fourth object of the present invention to provide a method of molding a resin sealing of an electronic part capable of preventing contamination of remaining air and moisture into a melted resin material by efficiently and surely exhausting the remaining air and moisture to the atmosphere.

It is a fifth object of the present invention to provide a method of molding a resin sealing of an electronic part capable of preventing contamination of air and moisture into a melted resin material by efficiently and surely exhausting to the atmosphere the air and moisture inside a resin tablet which is supplied into a pot.

It is a sixth object of the present invention to simplify the structure of the above-mentioned structure for forcibly evacuating the remaining air to the atmosphere to enhance the workability and operability, and to provide an apparatus for molding a resin sealing of an electronic part capable of simply and surely attaching and detaching both chase blocks to a stationary side and to a movable side for both of the stationary and movable molds.

The method of molding a resin sealing of an electronic part of the present invention which achieves the first and second objects relates to a method of molding to seal an electronic part with resin on a lead frame fitted inside a cavity by supplying a resin material into a pot of a resin molding mold including a stationary mold section and a movable mold section and heating to melt the resin material, and also by injecting the melted resin material into the cavities through a resin path of the mold. Now, the features of the method will be described. A hermetical seal is formed so that at least the pot, the resin path and the cavity portion of the mold are hermetically sealed. Also, the air inside the hermetical sealed space is exhausted to the atmosphere to provide a vacuum state inside the hermetically sealed space and the resin material, e.g. a resin tablet supplied into the pot is heated to be expanded for providing a permeability inside and outside the resin material, thereby implementing a condition under which the air and moisture closed inside the resin material can easily go out of the same when the resin material is expanded. Furthermore, by implementing a vacuum state in the hermetically sealed space under such a condition, the air and moisture inside the resin material are surely absorbed and exhausted or vented to the atmosphere.

By the present molding method, the air inside the pot, the resin path for transferring melted resin material, the mold cavities and air and moisture included in a resin material, e.g. a resin tablet, is forced out. The present method also prevents contamination of air into a melted resin material which is heated and melted inside the pot. Accordingly, the formation of voids and defective portions inside and on the surface of a molded resin body has been prevented.

Furthermore, sealing of an electronic part by molding with resin can be performed with certainty and the tight seal between the molded resin body and a lead frame of an electronic part is enhanced. Accordingly, the two can be integrated with certainty and its moisture resistance is enhanced.

A method of molding resin to seal an electronic part according to the present invention which achieves the third and fifth objects relates to a method of molding resin to seal an electronic part set in a cavity in which an upper mold section and a lower mold section face each other, a resin tablet is supplied into a pot provided in the upper mold section, the resin tablet is melted by heating and pressurizing, and the melted resin material is injected into the cavity between the upper and lower mold sections through a resin path. This method includes a step of excluding the outer air from an outer side periphery of at least a pot, a resin path, and a cavity portion in the above-described upper and lower mold sections, a resin tablet expanding step of heating and expanding in the pot the resin tablet supplied into the lower pot, an intermediate mold clamping step of both mold sections for closing the mold with a required gap maintained between the molding surfaces of the mold sections under the outside air excluded condition by the outside air excluding a step, a completely closing step of both mold sections for contacting the molding surfaces of both mold sections in the outside air excluded state caused by the outside air excluding step, and a forced exhausting step for evacuating any remaining air and moisture between the molding surfaces of both mold sections between a mold clamping step and the complete mold clamping step. The resin tablet is expanded upwardly inside the pot by the resin tablet expanding step to push out the air and moisture included inside the resin tablet to a portion between the surfaces of both mold sections and also the air and moisture are forced out by the above-stated forced exhaust or evacuating step.

According to this method, when the upper and lower mold sections are clamped intermediately and when the mold sections are completely clamped, by sliding both outside air excluding members so that both of the outside air excluding members fit together, an evacuated space portion can be easily formed surrounding an outer side periphery of at least a pot, a resin path, and a cavity portion in both molds.

Accordingly, when both molds are clamped intermediately, by driving a vacuum source communicating with the outside air excluded mold portion, the evacuation step can be performed efficiently and with certainty whereby air and moisture remaining in the outside air excluded mold portion is removed through a vacuum path to the outside.

Also, since the resin tablet supplied into the lower mold pot is heated on its bottom portion and the peripheral face and the top portion of the pot are open, the resin tablet expands upwardly from its upper face portion side in the pot to implement a permeable state between its inside and its outside.

Accordingly, the air and moisture included in the resin tablet sequentially go out to a portion between the molding surfaces of both mold sections from the upper surface side of the expanded resin tablet. Accordingly, the air and moisture is forced out by the forced exhaustion or evacuation step.

Also, since the air and moisture remaining in the outside air excluded space portion and the air and moisture included inside the resin tablet is exhausted to the outside by the forced exhaustion step, contamination of the air and moisture into a melted resin material is prevented efficiently and with certainty.

Another method of molding resin to seal an electronic part of the present invention which achieves the third and fifth objects relates to, in another aspect, a method of molding resin to seal an electronic part according to the multiplunger method for molding resin to seal an electronic part set in a cavity, in which an upper mold section and a lower mold section are provided opposite each other, resin tablets are supplied into a plurality of pots provided in the lower mold section, the resin tablets are melted by heating and pressurizing, and the melted resin materials are injected into cavities between the upper and lower mold sections through a resin path. This method includes a step of excluding outside air between both mold sections, whereby outside air is evacuated at least from the outer side periphery of the pot, the resin path, and the cavity portions, the upper and lower mold sections, a step of completely clamping both mold sections for connecting surfaces of both mold sections in the outside air excluded state, a resin tablet expanding step for heating and expanding the resin tablet supplied into the lower mold pot, and a forced exhaustion step for forcing any remaining air and moisture out of both mold sections through an air path provided between the surfaces of both mold sections. By the above-described resin tablet expanding step, the resin tablet is expanded upwardly in the pot with a permeability between inside and outside thereof and air and moisture included inside the resin tablet are expelled between molding surfaces of both mold sections, and the air and moisture are forced outside by the above-described forced exhaustion or evacuation step.

Also, in a preferred embodiment, a method of molding resin to seal an electronic part according to the present invention, the above described resin tablet expanding step includes a step of heating a bottom portion and a peripheral surface of a resin tablet to expand the resin tablet from its top surface upwardly in the pot.

The invention further includes a step of performing the above-mentioned forced exhaustion step while performing the step of heating and expanding the resin tablet in the pot, or while performing the process of heating and melting the resin tablet.

An apparatus for molding resin to seal an electronic part of the present invention which achieves the sixth object includes a mold for molding resin having a stationary mold section and a movable mold section oppositely provided, in which a pair of outside air excluding members are slidably fitted to the stationary mold section and the movable mold section covering outer side peripheries of the stationary mold section and the movable mold section at least at the position of a pot to be supplied with a resin material, a resin path, and a cavity portion for resin molding. A pair of outside air excluding members is arranged fittably to each other when the stationary mold section and the movable mold section are clamped together.

Each fitting face between the stationary mold section and the movable mold section and the pair of outside air excluding members and the fitting face between the pair of outside air excluding members are provided with a sealing member interposed therebetween. Furthermore, when the pair of outside air excluding members fit each other, the outside air excluded space portion set between the stationary mold section and the movable mold section and a vacuum source side communicate with each other through a vacuum path.

An apparatus for molding resin to seal an electronic part of the present invention which achieves the sixth object, in another aspect, includes a mold for molding resin having a stationary mold section and a movable mold section arranged opposite to each other and a pair of chase blocks detachably and fittingly attached to the stationary mold section and to the movable mold section, in which a pair of outside air excluding members covering an outer side periphery of the stationary mold section and of the movable mold section, at least at a portion of a pot for holding a resin material, a resin path, and a cavity portion for molding resin are respectively fitted slidably to the stationary mold section and the movable mold section. Both outside air excluding members of a pair are arranged to fit each other when the stationary mold section and the movable mold section are clamped together. These members are retractable to a position at which they do not interfere with the attaching and detaching work step when attaching and detaching the chase blocks to and from the stationary mold section and the movable mold section. A seal member is interposed between each fitting face of the stationary mold section and the movable mold section and the pair of outside air excluding members, and the fitting face between the pair of outside air excluding members. Furthermore, the outside air excluded space portion set between the stationary mold section and the movable mold section and a vacuum source side, are communicated with each other through a vacuum path when the pair of outside air excluding members fit together.

By the structure of the present invention, when clamping the stationary mold section and the movable mold section, a pair of outside air excluding members are fitted together for covering an outer periphery of at least a pot, a resin path, and cavities to easily form an outer air excluded space portion.

Accordingly, by operating a vacuum source communicating with the outside air excluded space portion, the air remaining inside the outside air excluded space portion (38) is efficiently and certainly exhausted outside through a vacuum path.

By performing a resin seal molding of an electronic part under this condition, contamination by any remaining air inside the outside air excluded space portion, into a melted resin material is prevented. Furthermore, even when the air inside the resin material goes out into the outside air excluded space portion in the process of heating and melting the resin material, the air can be prevented from mixing into the melted resin material.

The mutual fitting effect of both of the pair of outside air excluding members is achieved without any connection with the opening and closing effect of the stationary mold section and the movable mold section.

Also, an apparatus for molding resin to seal an electronic part according to the present invention, in its preferred embodiment, has the above-described pair of outside air excluding members which are respectively fitted slidably to another peripheral surface of both mold bases on the stationary side and on the movable side.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
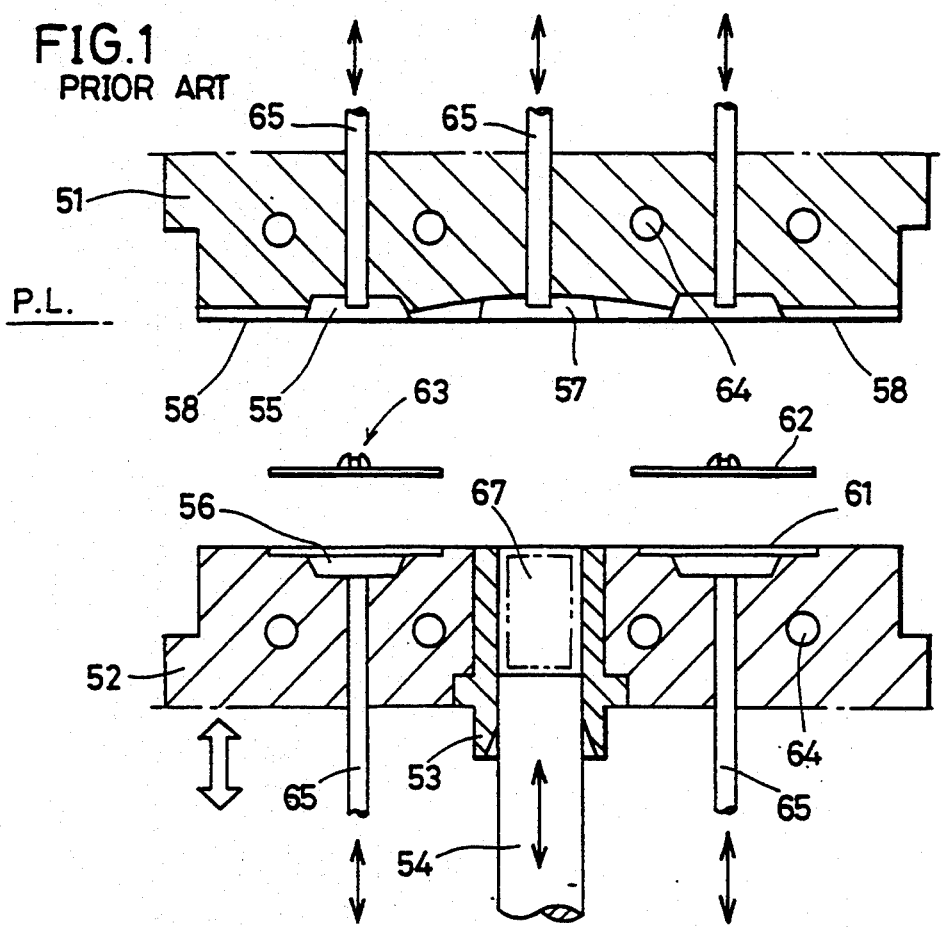
FIG. 1 is a partial broken longitudinal section illustrating an opened state of a main portion of an apparatus for molding resin to seal an electronic part by the transfer mold method of the first conventional example.
Figure 2:
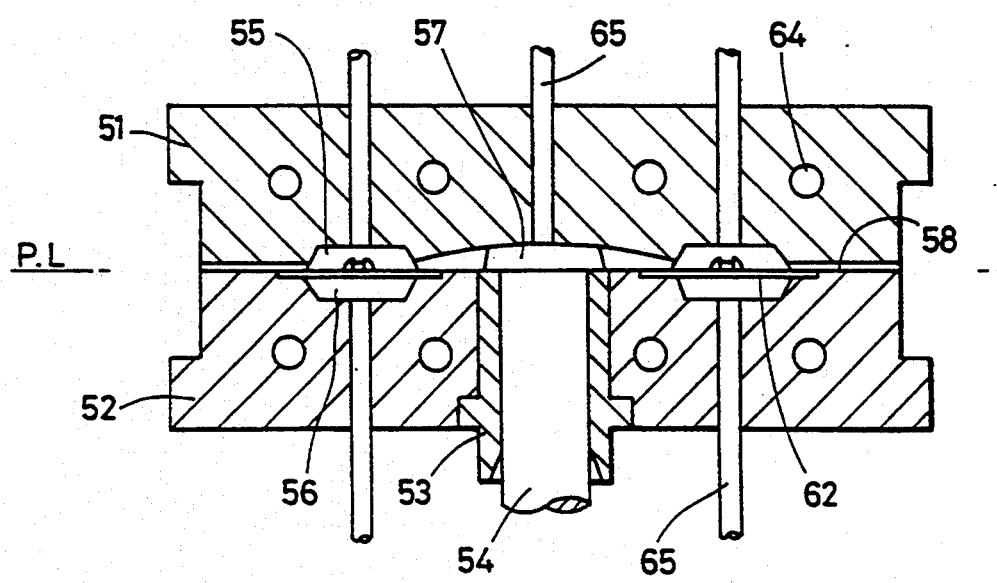
FIG. 2 is a partial broken longitudinal section illustrating a clamped state of the main portion of the apparatus shown in FIG. 1.
Figure 3:
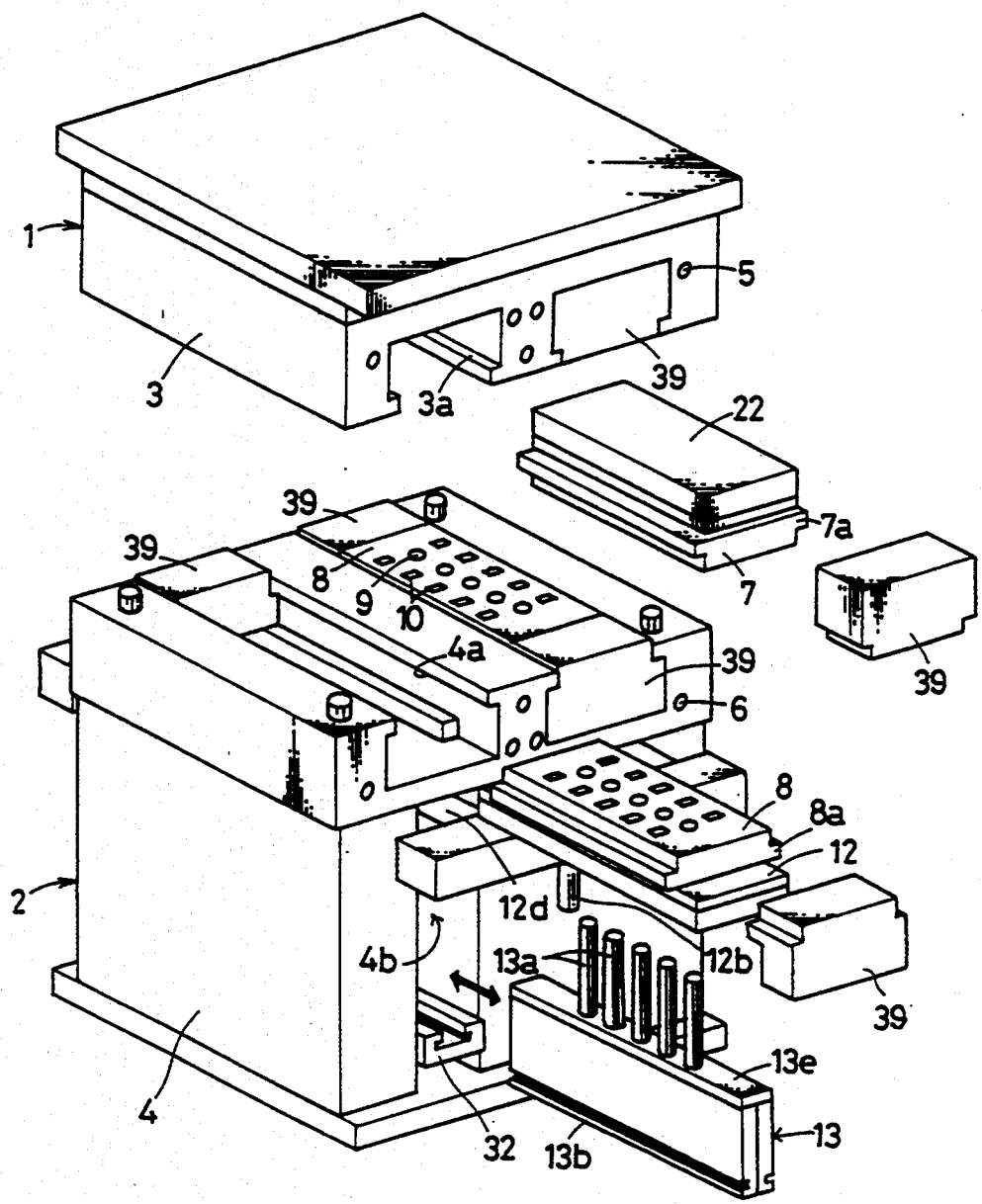
FIG. 3 is a partial exploded perspective view illustrating the entirety of a resin sealing molding apparatus of an electronic part by the transfer mold method of a second conventional example.
Figure 4:
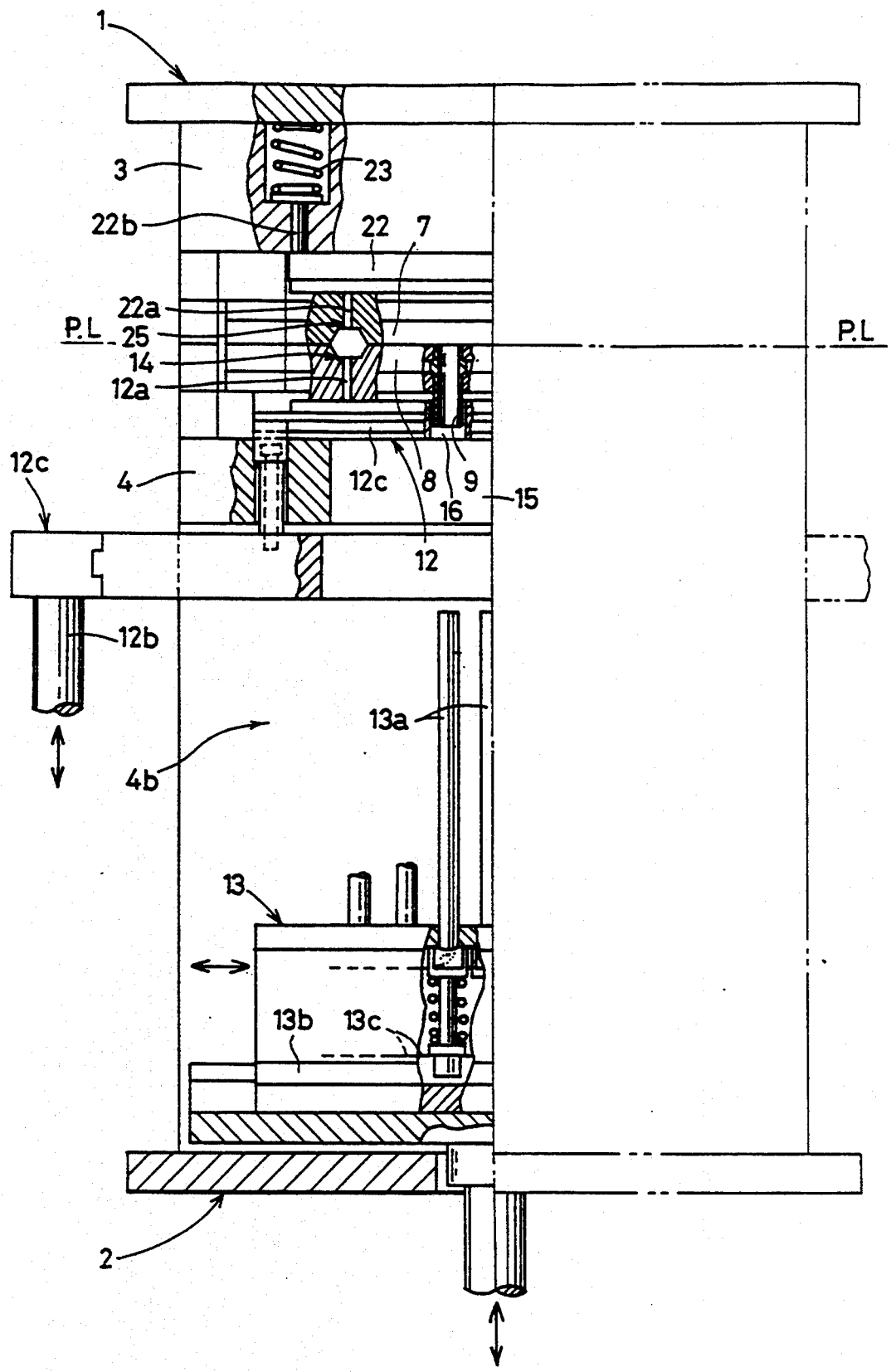
FIG. 4 is a partial broken longitudinal side section when the apparatus shown in FIG. 3 is in a mold clamped or closed state.

FIGS. 5 to 9, illustrate a first embodiment of a method of molding resin to seal an electronic part, according to the invention.

The mold apparatus for molding a resin encapsulation, includes an upper mold section forming a stationary mold 51, a lower mold section forming a movable mold portion 52 positioned opposite to the lapper mold section 51, a required number of pots 53 provided on the lower mold section 52, a plunger 54 for pressurizing a resin material each fitted to each of the pots 53, and a required plurality of upper cavities 55 and lower cavities 56 oppositely arranged on molding surfaces of the upper and lower mold sections. This structure is a multiplunger system in which each pot 53 and one or a plurality of cavity or cavities, in the figure, the upper cavity 55 are provided at predetermined positions and are communicated through a respective short resin path 57. All resin paths are of the same length or of substantially equal length.

The above-described lower mold section 52 is, for example, reciprocatable up and down by an appropriate mold opening and closing mechanism, not shown, which is electrically driven or uses fluid pressure such as oil pressure or the like as a driving source.

An upper end portion of each plunger 54 is always inserted into each pot and its lower end portion is freely and fittingly supported by a plunger holder, not shown. The plunger holder is, for example, provided for reciprocating up and down by an up and down reciprocating driving mechanism, not shown, which is electrically driven or uses fluid pressure such as oil pressure or the like as a driving source. By reciprocating the plunger holder up and down, each of the plungers 54 is reciprocated up and down. Furthermore, each plunger 54 is elastically biased in the upward direction by an elastic member such as a spring or the like provided inside the plunger holder or an appropriate pressing mechanism, not shown, by the fluid pressure or the like.

Air vents 58 communicating with the respective upper mold cavities 55 are formed on the above-described upper mold surface. These air vents 58 communicate with a common air path 59 functioning as an air vent, refer to FIG. 7, and the air path 59 communicates with a vacuum source, not shown, provided outside of the mold.

Figure 5:
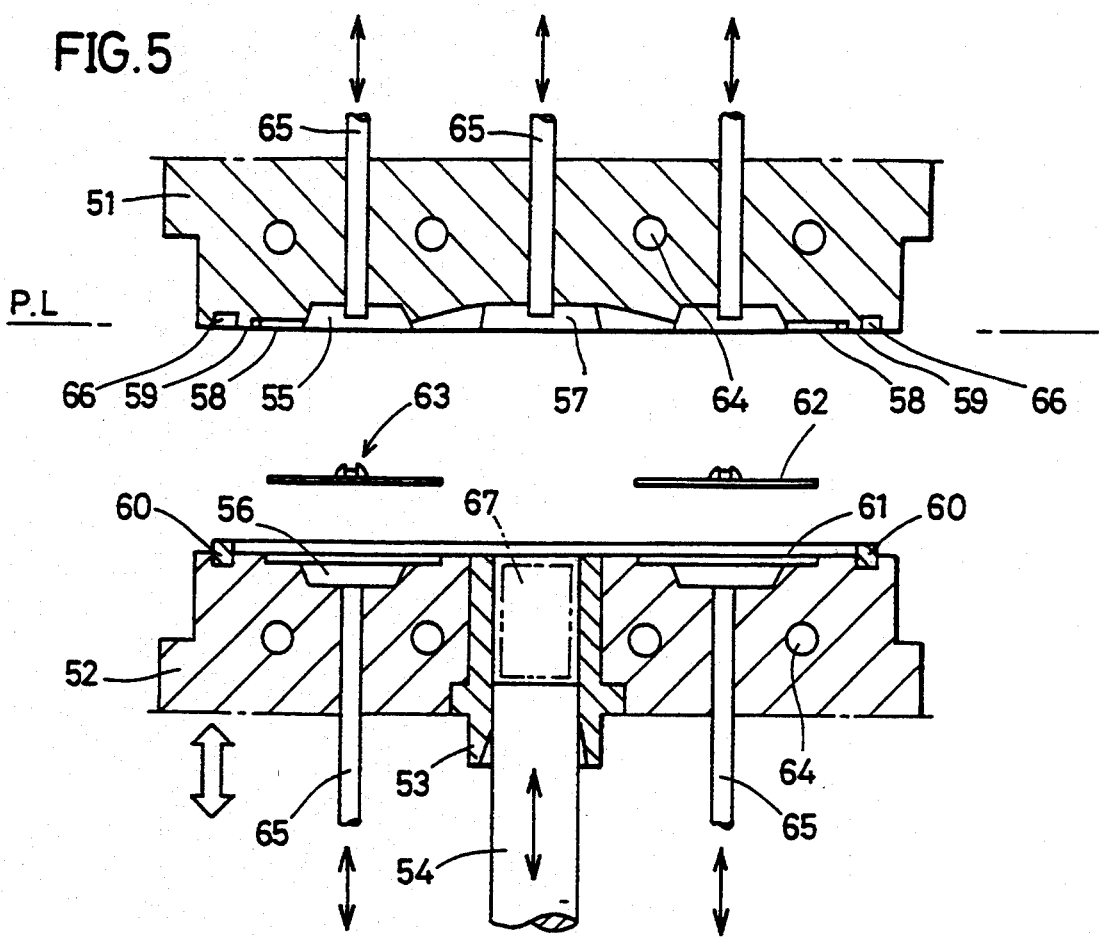
FIG. 5 is a sectional view illustrating a state in which mold sections are open, of a main portion of an apparatus for molding resin to seal an electronic part, of a first embodiment of the present invention.
Figure 6:
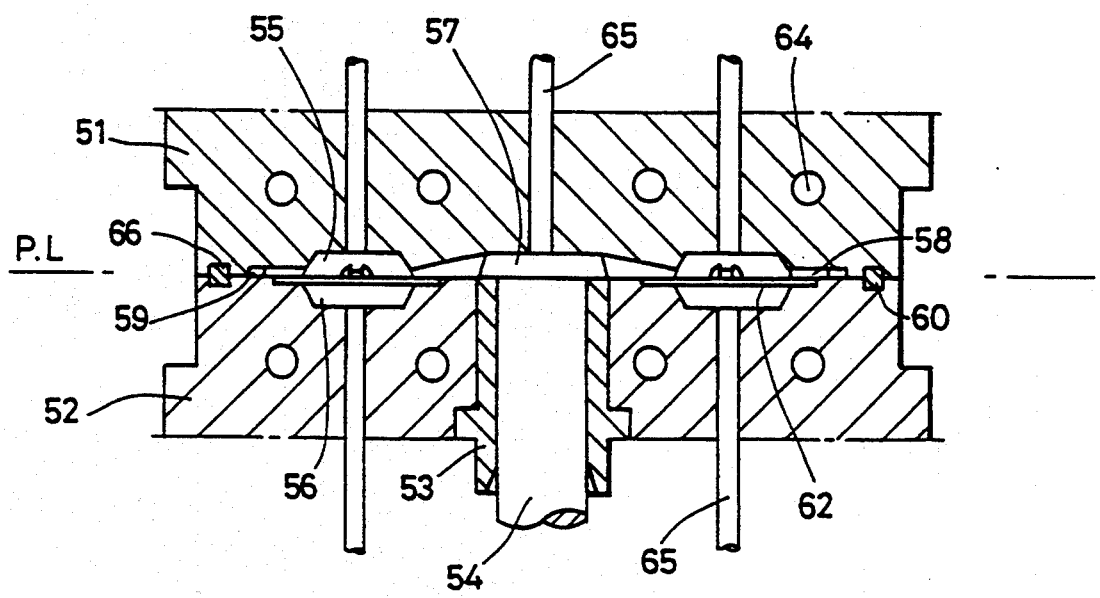
FIG. 6 is a sectional view illustrating a mold clamped or closed state of a main portion of the apparatus shown in FIG. 5.
Figure 7:
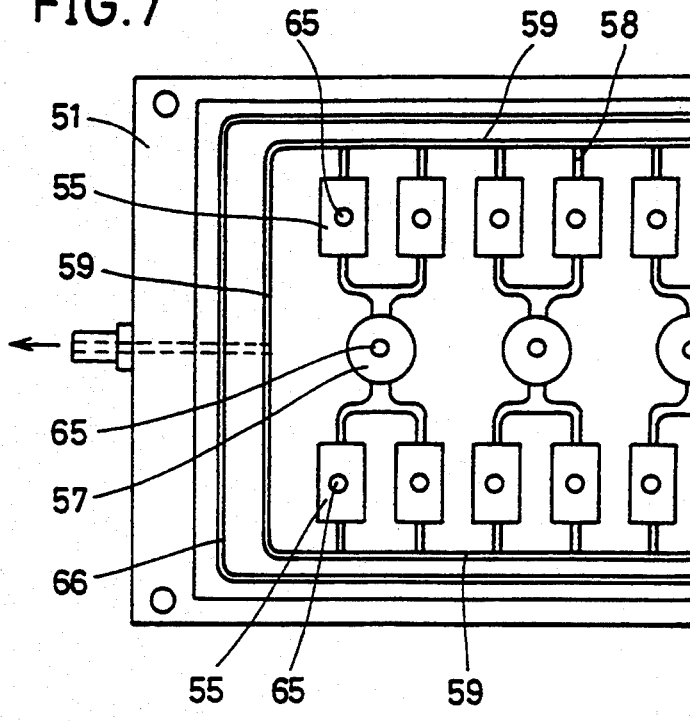
FIG. 7 is a partial broken bottom view illustrating a molding surface of an upper mold section of the apparatus shown in FIG. 5.
Figure 8:
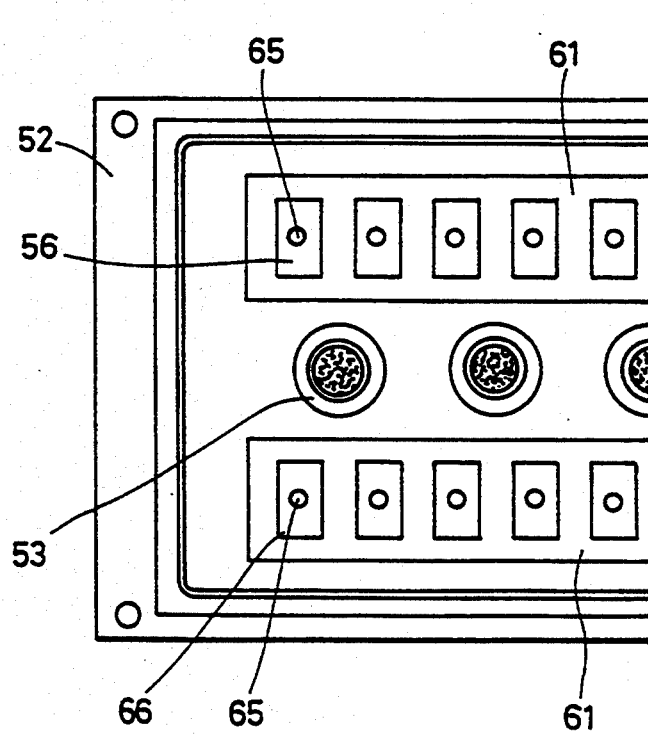
FIG. 8 is a partial broken plan view illustrating a molding surface of a lower mold section corresponding to the molding surface of the upper mold section shown in FIG. 7.

At a part of a mold face, in the figure, the lower mold surface which is an outer periphery of the air path 59 when the upper and lower mold sections 51, 52 are clamped to each other, an elastic, wear and heat resistant seal member 60 is provided, as shown in FIGS. 5 and 6.

Accordingly, when both of the mold sections are clamped together, at least the pot 53, the resin path 57 and both of the cavities 55, 56 and a space surrounded by the seal member 60 are hermetically sealed. By operating the vacuum source, the air inside the hermetically sealed space can be forced out to evacuate the hermetically sealed space.

Figure 9:
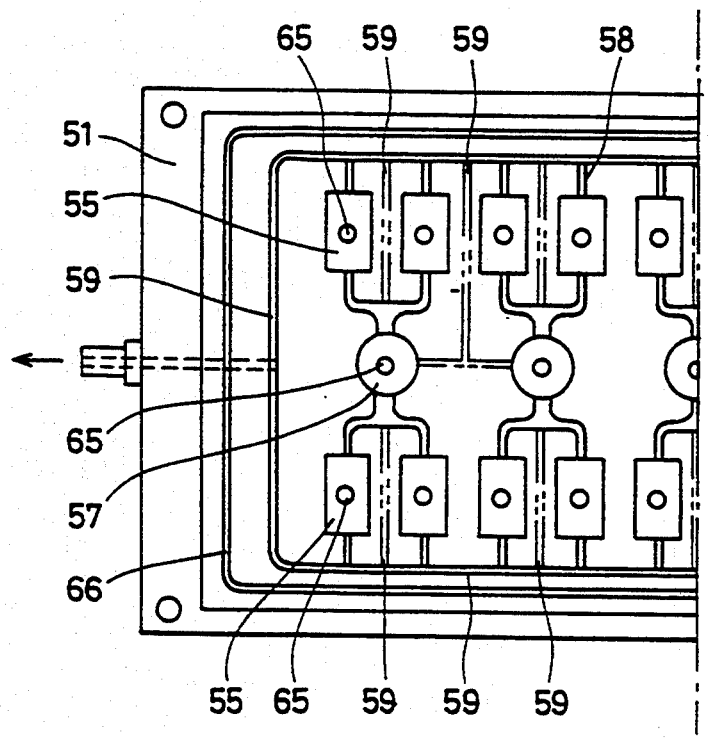
FIG. 9 is a partial broken bottom view illustrating an example of a structure different from that of FIG. 7, of the molding surface of the upper mold section.

The structure may be such that the air path 59 is connected to each pot 53 or each resin path 57 as shown by the chain line in FIG. 9, or the air path 59 shown by the solid line and that shown by the chain line in FIG. 9 can be provided together.

Furthermore, the above-mentioned seal member 60 may be provided at an appropriate portion such as a fitting surface or a connecting surface and the like when the upper and lower molds are clamped together, as needed.

Each of the cavities 61 in the lower mold surface fittingly receives a lead frame 62 therein. The numeral 63 denotes an electronic part attached on the lead frame 62, and the numeral 64 denotes a heater for heating the upper and lower mold sections, respectively.

Ejector pins 65 forming part of a mold releasing mechanism, not shown, are so adapted that the tip surfaces retract to the inner bottom faces of cavities 55 and 56 and of resin path 57, respectively, when the molds are clamped together as shown in FIG. 6. On the other hand, when the molds are opened as shown in FIG. 5, respective tip surfaces can advance to respectively push out molded resin bodies and a lead frame within both cavities and hardened resin in the resin path.

A groove 66 holds a seal member 60 positioned in the upper mold surface.

A method of molding resin to seal an electronic part according to the present invention using the above-described mold apparatus, will now be described.

Similarly to the conventional case, the stationary upper mold section 51 and the movable lower mold section 52 are heated to a predetermined resin molding temperature, for example, about 175° C., by a heater 64 prior to introducing the resin.

Next, the lower mold section 52 is moved downwardly by the mold opening and closing mechanism to open the upper and lower mold sections 51, 52, refer to FIG. 5.

Next, a lead frame 62 having an electronic part 63 attached thereon, is supplied and set in a predetermined position in a cavity 61 provided on a mold surface of the lower mold section 52.

Next, the lower mold section 52 is moved upwardly by the mold opening and closing mechanism to close the upper and lower mold sections 51, 52 as shown in FIG. 6.

At this time, each pot 53 and resin path 57 and both of the upper and lower cavities 55, 56 are hermetically sealed by the seal member 60 provided around the outer periphery of air path 59. The space surrounded by the seal member 60 is a hermetically sealed space. The electronic part 63 and the lead frame 62 around the same are fitted inside both cavities 55, 56 oppositely provided on both of the mold surfaces. A resin tablet 67 in each pot 53 is heated to gradually melt. Furthermore, under such a condition, driving the vacuum source, the air within the hermetical space is forced outside to evacuate the hermetically sealed space. An intermediate vacuum state of approximately $1-10^{-3}$ Torr is enough as the vacuum state, but it may be set to obtain a higher vacuum state than that, and the set conditions and the like can be appropriately and desirably set by adjusting the vacuum source, for example.

The above-mentioned resin tablet 67 usually includes air and moisture while exposed to the atmosphere in the step of molding the resin tablet for solidifying the resin powder, or after the molding. Accordingly, the resin tablet 67 supplied into pot 53 thermally expands because of heating by the heated mold.

The method of the present invention is characterized in that, utilizing the thermal expanding effect of the resin tablet 67, air and moisture included inside are absorbed and exhausted by force out of the hermetically sealed space and the resin tablet 67 is heated and pressurized to be completely melted after that or while it is absorbed and exhausted out of the hermetically sealed space.

That is to say, in the step of heating and melting resin tablet 67 in pot 53, by operating a vacuum source, not only air and moisture in the pot 53, resin path 57 for transferring the melted resin material and both cavities 55, 56 for resin molding within the hermetically sealed space, but also air and moisture inside the resin tablet 67 which were first absorbed and then forced out by the vacuum effect while the resin tablet 67 was expanding, are absorbed and forced out of the hermetically sealed space.

Furthermore, with air and moisture removed from the pot 53, the resin path 57 and from both of the cavities 55, 56 and from the resin tablet 67, the resin tablet 67 is heated and pressurized to be completely melted.

Next, pressurizing the resin tablet 67 in the pot 53 with plunger 54 injects the melted resin material into both cavities 55, 56 through resin path 57 provided between the pot 53 and the upper mold cavity 55, whereby the electronic part 63 and the lead frame 62 around the part 63 are encapsulated in a molded resin body which is molded corresponding to the shape of both cavities.

Accordingly, after the time required for hardening the melted resin material has passed, both of the upper and lower mold sections are opened and the hardened resin body and lead frame 62, and the hardened resin inside the resin path are simultaneously discharged by ejector pins 65.

As described above, since not only air and moisture inside pot 53, resin path 57 and both cavities 55, 56 in the hermetically sealed space but also air and moisture inside the resin tablet 67 can be efficiently and surely forced out of the hermetically sealed space, contamination of air and moisture into the melted resin material has been completely prevented.

That is, the resin tablet 67 can be heated and melted with the air and moisture being removed, so that voids and defective portions are not formed inside the molded resin body of the electronic part molded in the above-described respective steps nor on the surface thereof.

Also, as described above, in addition to evacuating the hermetically sealed space, the air and moisture inside the resin tablet 67 is forcibly evacuated out of the hermetically sealed space to completely prevent contamination of the air and moisture into the melted resin material, so that molding to seal the electronic part with resin is efficiently performed with certainty. Further, the melted resin material and lead frame 62 strongly adhere to each other due to the molding.

Furthermore, the melted resin material and lead frame 62 are in a complete adhered state without an air layer, void and the like interposed on the contacting surface of the two. Accordingly, when an outer lead protruding from the molded resin body is bent, problems, such as cracks and defects in the molded resin body due to the bending force applied to a base portion of the outer lead have been avoided.

For example, the removal of air and moisture from inside the resin material may be performed during or after heating and expanding the resin material, or resin tablet, supplied into the pot, and the resin material may be pressurized to be completely melted thereafter.

Also, there is no problem in performing a pre-heating step for preliminarily heating to thermally expand the resin material before supplying the resin material or resin tablet into a pot, and also performing a resin pressurizing step for immediately pressurizing the resin material to be melted while heating the resin material after being supplied into the pot.

Furthermore, without the pre-heating step for the resin material or resin tablet outside the pot, the pre-heating step may be performed inside the pot by placing the resin material at room temperature into the pot and then holding the resin material in the pot for a required length of time.

A small resin tablet or mini tablet of approximately 7 g or lighter may be used as a resin material, for example.

Expecially, when using the above-described apparatus for resin seal molding of the multiplunger type, this kind of small resin tablet can be introduced to enhance the heating efficiency and also to reduce the total time for molding. In this case, the above described pre-heating step of the resin material or resin tablet can be performed inside or outside of the pot.

The present method provides, in addition to the effective and certain removal of air and moisture, an intimate close bond between a molded resin body of an electronic part and a lead frame. These features assure an enhanced moisture resistance of the resulting products which have a high quality and a high reliability.

Figure 10:
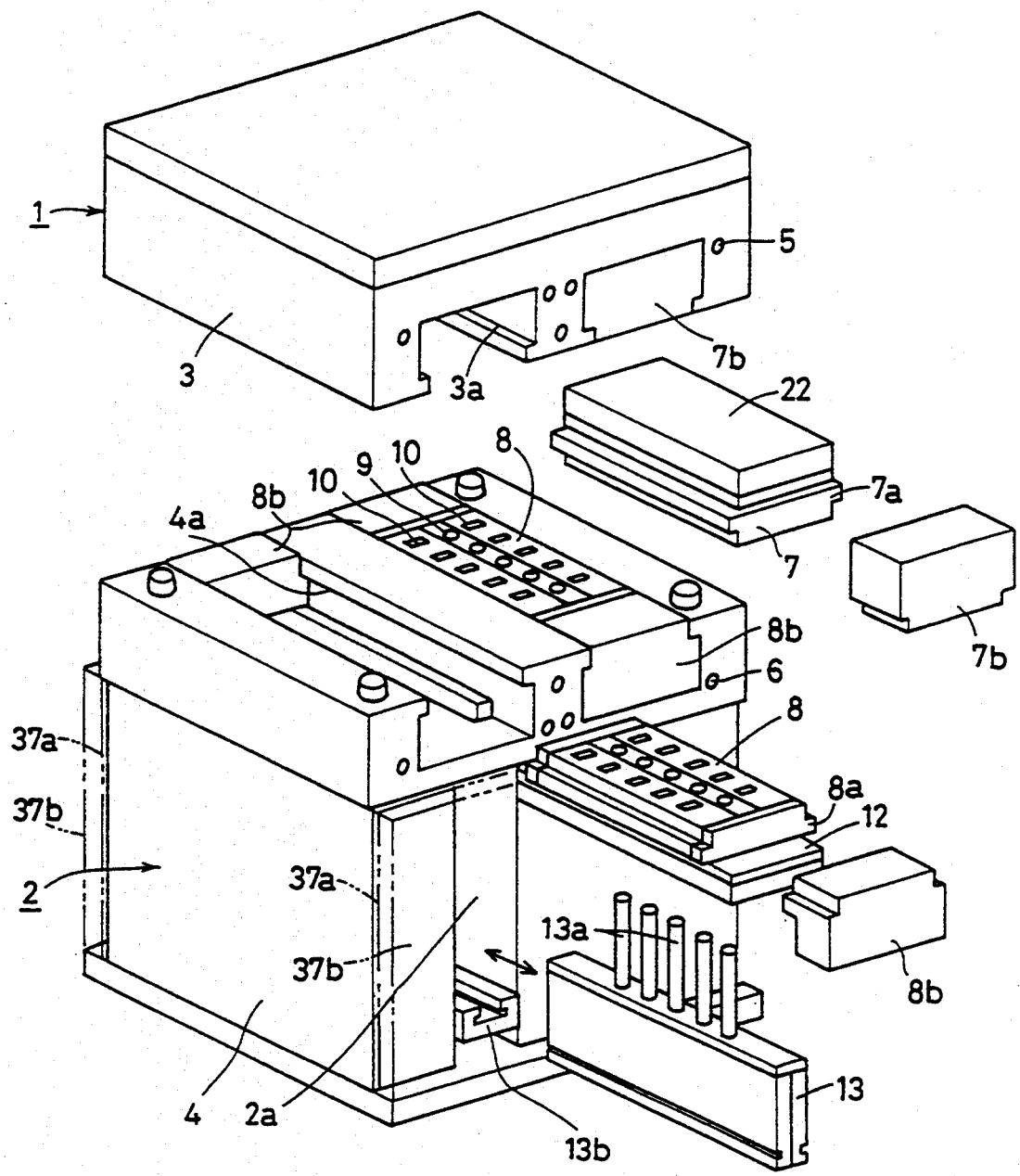
FIG. 10 is a partial exploded perspective view illustrating the entirety of an apparatus for molding resin to seal an electronic part, of a second embodiment of the present invention.

A second embodiment will now be described with reference to FIGS. 10 to 19. In FIG. 10, the structure of an apparatus for molding resin to seal an electronic part is schematically shown. FIGS. 11 to 14 show schematically a main portion of a mold in the apparatus. The main portion of the mold is shown enlarged in FIGS. 15 to 18.

In this apparatus, an upper stationary mold section 1 is provided on an upper stationary plate and a lower movable mold section 2 is provided on a lower movable plate. The upper and lower mold sections are arranged opposite each other.

Heaters 5, 6 respectively are provided on a mold base 3 of the stationary upper side and a mold base 4 of the movable lower side. A stationary side chase block 7 is detachably attached to the stationary side mold base 3 by a dovetail groove 3a engaging a dovetail portion 7a, or the like.

A movable side chase block 8 is detachably attached to the movable side mold base 4 by a dovetail groove 4a, a dovetail portion 8a or the like.

The chase blocks 7, 8 fitted into the mold bases 3, 4 fit at predetermined positions through appropriate blocks 7b, 8b fixed at the front and back sides.

Although the case where both of the front and back ends of both chase blocks 7, 8 are fixed to blocks 7b, 8b has been illustrated in FIG. 10, it is possible to omit either one of the blocks 7b, 8b, e.g., the back side blocks of the device and form portions corresponding to the blocks on the one side and on both mold bases 3,4 integrally.

Furthermore, an appropriate seal member not shown may be interposed between both chase blocks 7, 8 and both stationary blocks 7b, 8b.

A required plurality of resin material supply pots 9 is provided in the movable side chase block 8. A required plurality of resin molding cavities 10 are provided at predetermined positions near the respective pots 9.

Dedicated heater 11 is provided in the movable side chase block 8.

A lower portion ejector plate 12 having an ejector pin 12a for releasing a resin body molded inside cavity 10, and a plunger holder 13 having a pressurized plunger 13a for pressuring each resin tablet 17 supplied into each pot 9, are respectively provided at positions below the movable side chase block 8.

An upper end of each of the ejector pins 12a fits into a pin hole 14 communicating with each cavity 10.

An upper end of each of the plungers 13a fits into each pot 9 through insert holes 15, 16 provided in the movable side mold base 4 and ejector plate 12.

The plunger holder 13 is detachably secured to a rail member 13b provided at a lower portion of the movable side mold base 4.

Appropriate seal members, not shown, are preferably interposed between a fit lower portion of the ejector plate 12 in the movable side mold base 4 and the outside, and between a fit portion of the plunger holder 13 and the outside.

Cavities 20 corresponding to the positions and number of cavities 10 of the movable side chase block, are respectively provided in the stationary side chase block 7.

A dedicated heater 21 is provided in the stationary side chase block 7.

An upper portion ejector plate 22 having ejector pins 22a for releasing resin bodies molded in cavities 20 and a pin 22b for supporting the upper ejector plate, and an elastic member 23 such as a spring for pushing down the upper ejector plate 22 through the supporting pin 22b, are respectively provided above the chase block 7.

A lower end of each of the ejector pins 22a is fitted into a pin hole 24 communicating with each cavity 20 and a pin hole 24a communicating with a cavity 25 positioned opposite of each pot 9.

Figure 11:
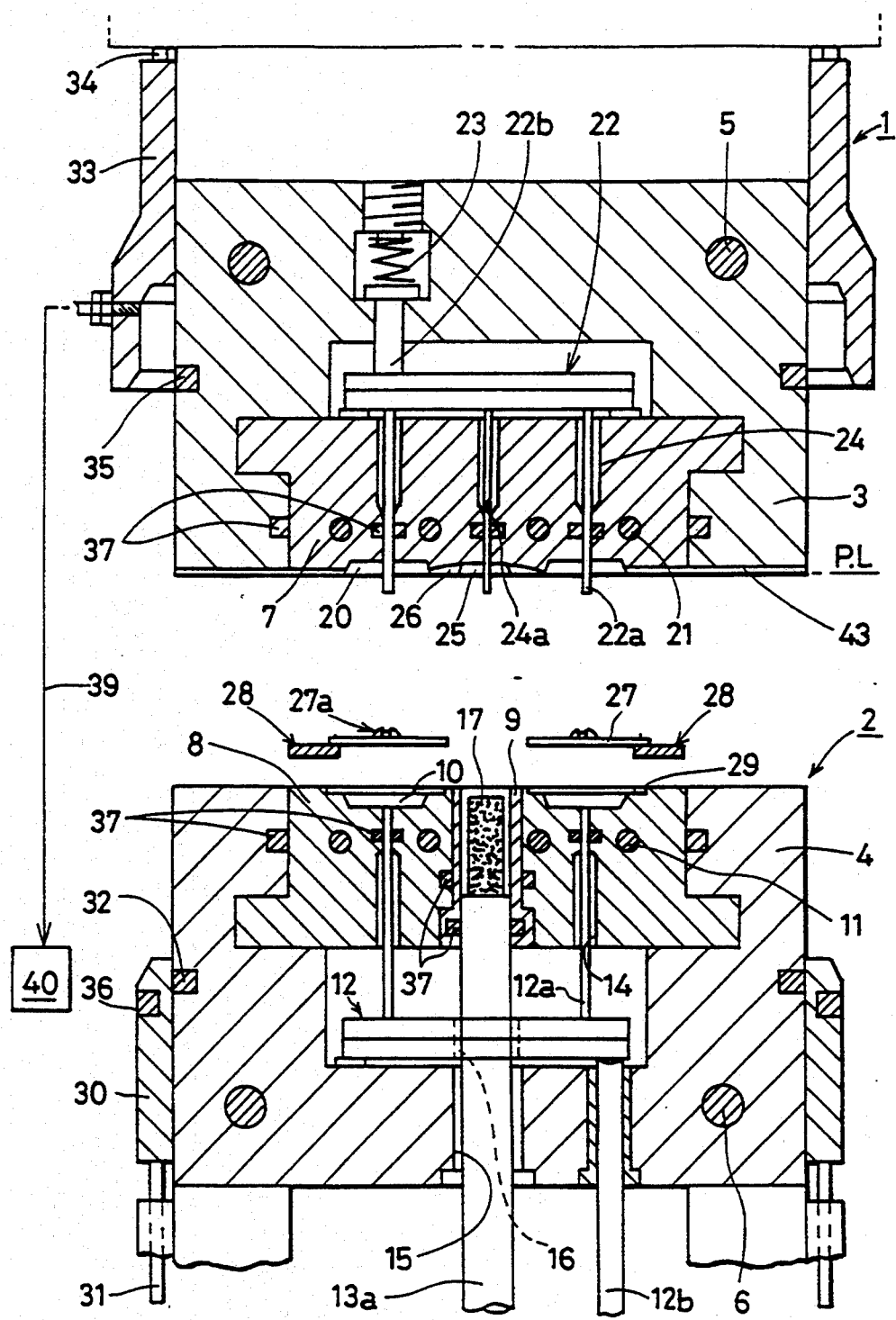
FIG. 11 is a partial broken longitudinal section illustrating a mold open state of a main portion of the apparatus shown in FIG. 10.
Figure 14:
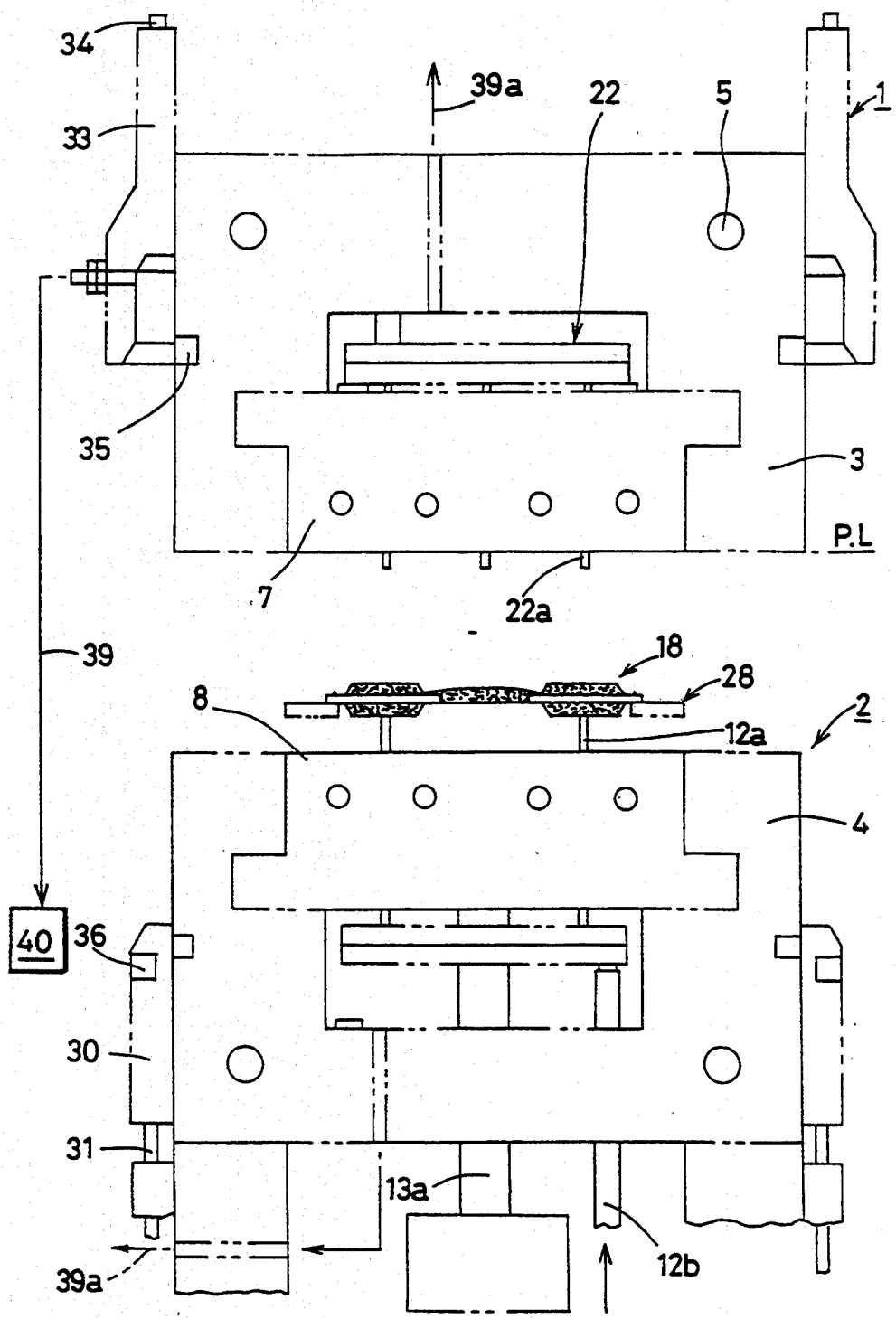
FIG. 14 is a diagram for describing a releasing operation of a molded resin body from the mold when the mold sections are opened after a resin molding operation, of a main portion of the apparatus shown in FIG. 10.
Figure 15:
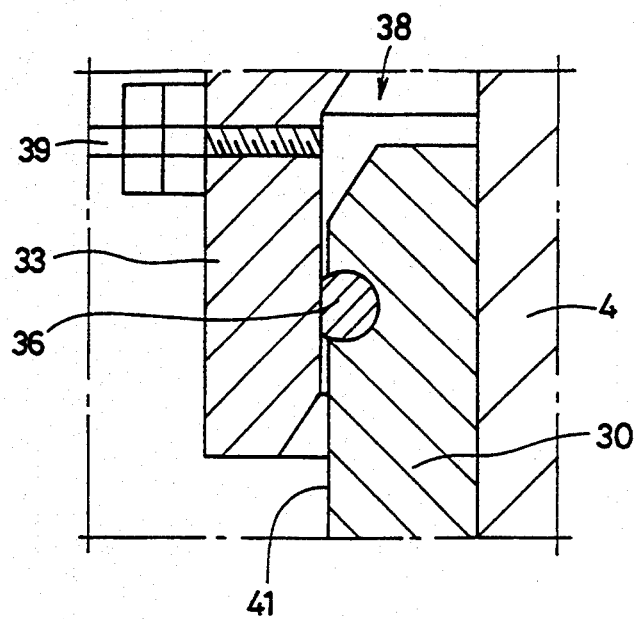
FIG. 15 is a partial broken and enlarged section of a fitting portion of a pair of outside air excluding members of the apparatus shown in FIG. 10.

The ejector plate 22 is pushed down by the elasticity of the elastic member 23 when both mold sections 1, 2 are opened as shown in FIGS. 11 and 14. The molded resin body 18 hardened within the cavities 20 and a resin portion formed in cavity 25 and in a gate area 26 having a required length between the pots 9 and the cavities 20, are released from the mold downwardly as shown in FIG. 14.

When the mold sections 1, 2 are opened, the lower ejector plate 12 is pushed up by an ejector bar 12b and each ejector pin 12a releases a molded resin body 18 from each cavity 10 upwardly as shown in FIG. 14. When the mold sections are complete clamped together, upper and lower return pins, not shown, positioned opposite to each other in the upper and lower ejector plates 22, 12, retract both ejector plates upwardly and downwardly respectively as shown in FIG. 13.

In the above-described movable side mold base 4, an outside air excluding member 30 of cylindrical shape, rectangular shape or the like, is fitted to cover at least the outer periphery of each pot 9 and each cavity 10 in the molding surfaces of the lower mold section 2, which is provided slidably in the direction of opening and closing the mold sections by a suitable driving mechanism 31. Furthermore, an appropriate seal member 32 is provided at a fitting surface of the movable side mold base 4 and the outside air excluding member 30.

A further outside air excluding member 33 of cylindrical shape, rectangular shape or the like is fitted in the stationary mold base 3 covering the outer periphery of at least each resin path including the cavity 25 and the gate portion 26 and each cavity 20 in the mold surface of the upper mold base 3, which is slidable in the direction of opening and closing the mold sections through a suitable driving mechanism 34. Furthermore, an appropriate seal member 35 is provided on the surface of the stationary mold base 3 and the outside air excluding member 33.

Figure 12:
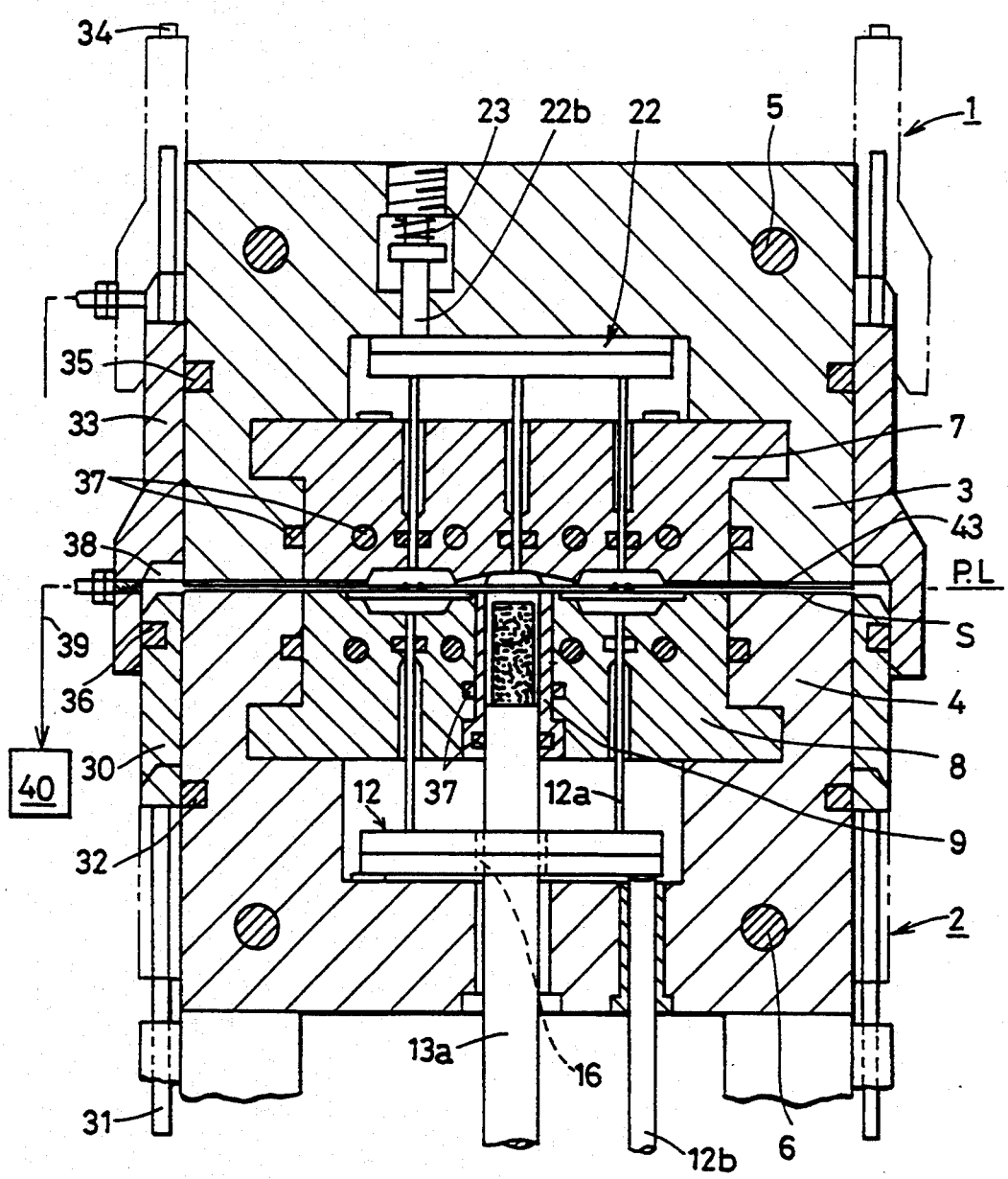
FIG. 12 is a partial broken longitudinal sectional view illustrating an intermediate mold clamped or partly closed state of a main portion of the apparatus shown in FIG. 10.
Figure 13:
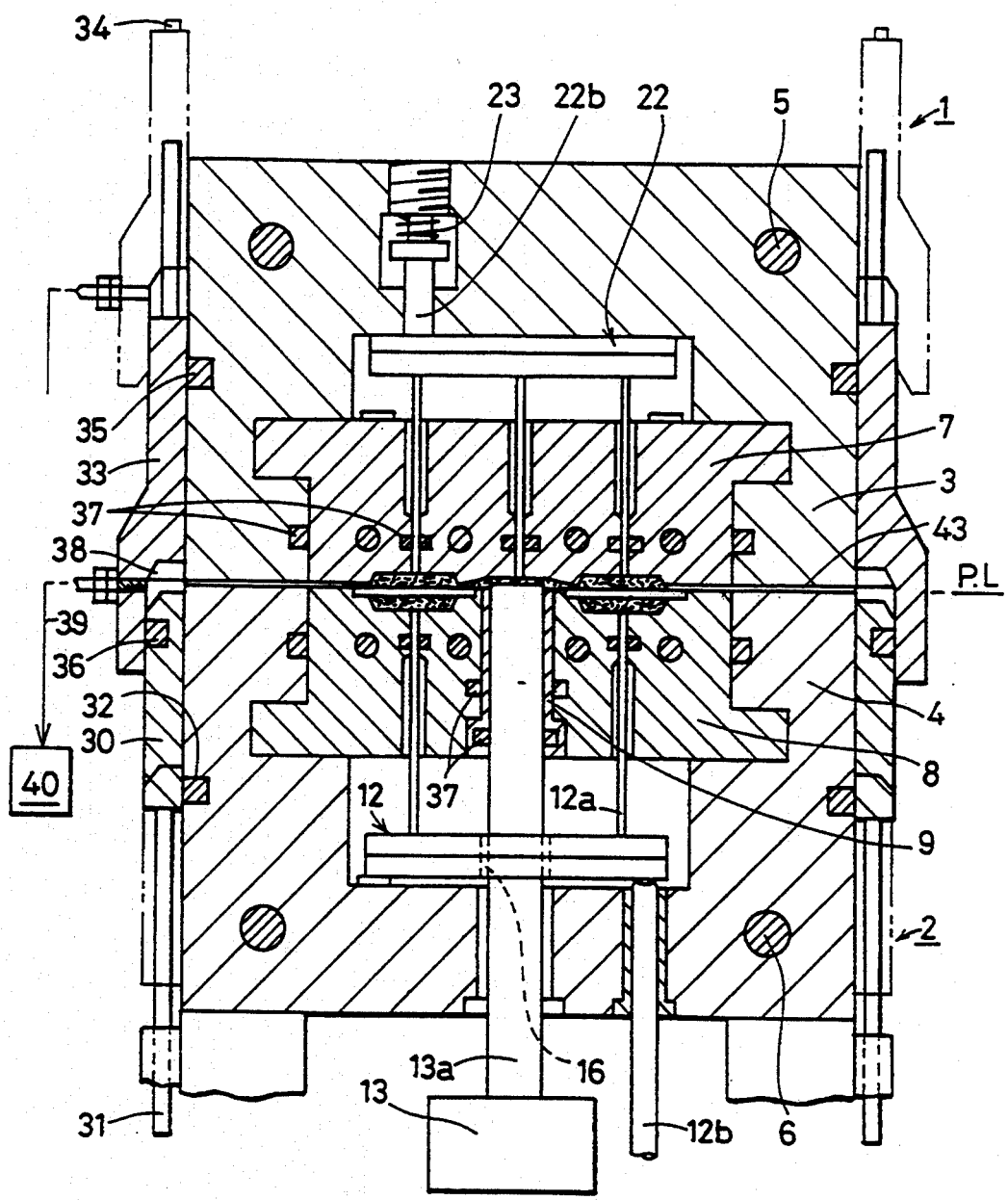
FIG. 13 is a partial broken longitudinal view illustrating a completed mold clamped or fully closed state of a main portion of the apparatus shown in FIG. 10.

At the time of intermediate mold clamping as shown in FIG. 12 and at the time of complete mold clamping as shown in FIG. 13 of both mold sections 1, 2, moving ahead both of the outside air excluding members 30, 33 in the mold clamping direction by the driving mechanisms 31, 34, tip portions of both of the outside air excluding members 30, 33 fit together.

FIG. 13 illustrates the case where an upper end of the outer air excluding member 30 fitted to the movable mold base 4, is moved upwardly to the vicinity of the mold surface of the lower mold section 2 and the outside air excluding member 33 fitted to stationary mold base 3 is engaging with a close fit the peripheral surface of outer air excluding member 30 of the movable mold base 4.

An appropriate seal member 36 is provided at the interface between both outside air excluding members 30, 33. Furthermore, appropriate seal members 37 are provided between both mold bases 3, 4 and both chase blocks 7, 8, between chase blocks 7, 8 and each of the ejector pins 22a, 12a, and between the movable chase block 8 and pot 9 and plunger 13a.

Accordingly, at the time of intermediate mold clamping and at the time of complete mold clamping of both molds 1, 2 shown in FIGS. 12 and 13, by fitting together tip portions of both outside air excluding members 30, 33, between molding surfaces of both molds 1, 2, a space 38 is formed from which outside air is excluded by both outside air excluding members 30, 33 and each of the seal members 32, 35, 36, 37.

A portion between surfaces of both mold sections 1, 2 is in a state in which outside air is substantially excluded by both of the seal members 35, 36, so that seal members 37 are not necessarily required.

In place of the provision of the respective seal members 37, or when omitting the same, as described above, an appropriate seal member is preferably provided between both chase blocks 7, 8 and between both stationary blocks 7b, 8b.

Furthermore, an appropriate seal member 37a and a seal cover 37b may be provided between space portion 2a of lower mold section 2 for the fitting plunger holder 13 and the atmosphere to introduce the structure for excluding outside air from the space portion 2a as shown in FIG. 10.

One end of vacuum path 39 such as a vacuum pipe is connected to the outside air excluding space portion 38 formed when both of the outside air excluding members 30, 33 are fitted together, and the other end of the vacuum path 39 is connected to an appropriate vacuum source 40 such as a vacuum pump or the like.

Figure 16:
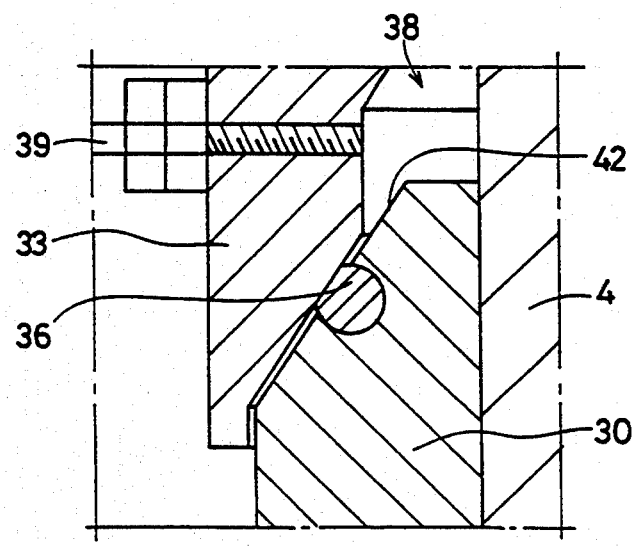
FIG. 16 is a partial broken and enlarged section illustrating another example of a shape of a fitting portion of the pair of outside air excluding members.

The fitting planes or surfaces of both of the outside air excluding members 33, 30 can be sectional vertical planes 411 as shown in FIGS. 11 to 15, or it can be a tapered plane 42 as shown in FIG. 16. That is to say, it is sufficient that the members can exclude a flow of air and moisture between the two by seal member 36 interposed between the two members 30, 33.

Accordingly, when the vacuum source 40 is operated at the time of intermediate mold clamping of both mold sections 1, 2 as shown in FIG. 12, any remaining air and moisture in the sealed space portion 38 including the pot 9, the resin path 25, 26, and the cavity 10, 20 portion, are absorbed and exhausted for the air and moisture to be forced outside to implement a vacuum state in the entirety of the sealed space portion 38.

If vacuum source 40 is operated at the time of complete mold clamping of both mold sections 1, 2 shown in FIG. 13, air and moisture inside the pot 9, the resin path 25, 26, the cavity 10, 20 portion are forced out through an air vent 43 provided in at least one of the molding surfaces of both molds. In FIG. 13 the molding surface of the upper mold section forms an air vent, which also permits implementing a vacuum state in the entire sealed space portion 38.

The vacuum state in the space portion 38 is maintained with certainty by continuously performing the forced exhaustion action during the intermediate mold clamping and the forced exhaustion action at the complete mold clamping.

Figure 18:
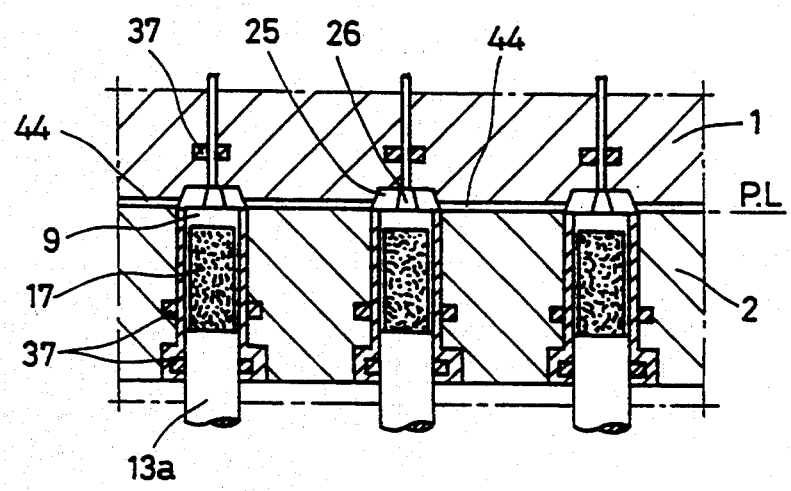
FIG. 18 is a partial broken and enlarged section illustrating the vicinity of a pot in the complete mold clamped or closed state when the apparatus shown in FIG. 10 involves a multiplunger system.

In FIG. 18, a mold in an apparatus for molding resin to seal an electronic part by the multiplunger system in which a plurality of pots are provided in its lower mold is shown, which is in the completely clamped state. In FIG. 18, the case is illustrated in which a desired air path 44 for communicating pot 9, the resin path 25, 26 to the atmosphere through the sealed space portion 38, is provided between molding surfaces in both mold sections 1, 2.

As required, by providing a valve pin for opening and closing the path at a desired portion of the air path 44, the structure may be used for preventing melted resin material from invading into the path when molding resin, for example.

As described above, if a desired air path 44 is provided for communicating the pot and the resin path to the atmosphere between the molding surfaces of both molds, the air can be evacuated from the sealed space portion 38 in the complete mold clamping state for establishing an evacuated state, whereby the intermediate mold clamping of both mold sections may be omitted and the total molding time can be reduced.

The above-mentioned outside air excluding members 30, 33 are constructed to be retracted to a position at which they do not interfere with detaching and attaching/exchanging work steps of both chase blocks 7, 8 and of both mold bases 3, 4 through both of the driving mechanisms 31, 34.

Accordingly, since the opening and closing operations of both mold sections 1, 2 can be performed with both outside air excluding members 30, 33 moved ahead to the advanced position shown in FIGS. 12 and 13, respectively, it is not necessarily required to retract both of the outside air excluding members 30, 33 in every molding cycle.

Although the case in which the sealed space portion 38 is formed at the contacting surfaces of both molds 1, 2 and the outer periphery thereof in the present apparatus, an air hole may be provided between the sealed space portion 38 and the fitting space portion of both ejector plates 12, 22 in both mold sections to provide a structure from which any remaining air and moisture inside the fitting space portion, can also be exhausted to the atmosphere, simultaneously.

Similarly, a structure can be provided which can be evacuated to remove any remaining air and moisture from the fitting space portion of both ejector plates 12, 22 through a desired vacuum path 39a as shown in FIG. 14.

Although structure of the type in which both chase blocks 7, 8 are frequently detached and attached, is shown in the above-described figures, the present teaching is similarly applicable to an apparatus for molding resin to seal an electronic part, wherein the chase blocks are not detachable.

As the above-described driving mechanisms 31, 34 for the outside air excluding members 33, 30, for example, any mechanical driving mechanisms such as an appropriate rack and pinion mechanism, electric driving mechanisms such as an electric motor, and fluid driving mechanisms such as hydraulic or pneumatic devices can be used. However, in view of the molding resin to seal an electronic part, it is preferred to use the above-described electrical driving mechanism or the pneumatic driving mechanism.

A method of molding resin to seal an electronic part 27a attached to a lead frame 27 using the above-described apparatus will now be described below.

First, lead frame 27 is set in a predetermined position in a concave portion 29 provided in a molding plane of a lower mold section by an appropriate supply/retrieve mechanism 28 and a resin tablet 17 is supplied into each pot 9 as shown in FIG. 11.

Figure 17:
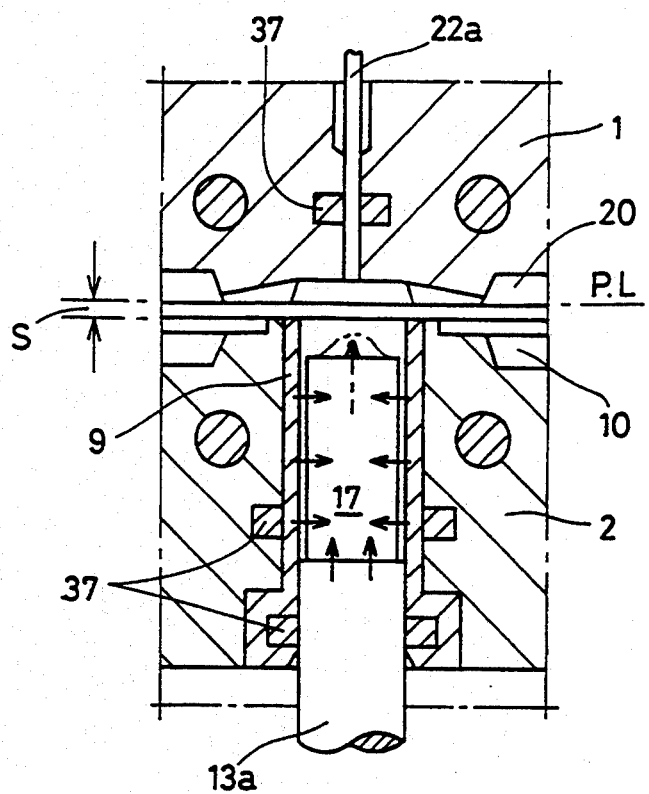
FIG. 17 is a partial broken and enlarged section illustrating the vicinity of a pot in the intermediate mold clamped state of the apparatus shown in FIG. 10.

Next, the lower mold section 2 is raised by a lower movable plate and an intermediate mold clamping step is performed with a desired gap S being maintained between the molding surfaces of the upper and lower mold sections 1, 2 as shown in FIGS. 12 and 17.

Next, in the intermediate mold clamping state, both of the outside air excluding members 30, 33 are shifted to fit these members together to form a sealed space portion 38 surrounding an outer periphery of at least the pots 9, the resin path 25, 26 and a cavity 10, 20 portion in both of the molds as shown in FIGS. 12 and 17.

Next, in this intermediate mold clamping state, the vacuum source 40 connected to the sealed space portion 38, is operated to force out the remaining air and moisture inside the sealed space portion through vacuum path 39. Accordingly, at this time, the entire sealed space portion 38 including the pots 9, the resin path 25, 26 and the cavity 10, 20 portion is in a vacuum state.

Next, the lower mold section 2 is further raised to completely close the mold as shown in FIG. 13.

In this completely closed state of the mold, the forced exhaustion action inside the sealed space portion 38, is maintained by the vacuum source 40.

Since resin tablets 17 in pots 9 are sequentially melted by the heaters 5, 6, 11, 21, the melted resin material can be injected into both cavities 10, 20 through resin path 25, 26 by pressurizing the resin tablets 17 with a plunger 13a to encapsulate the electronic part 27a set in the cavity, in molded resin body 18.

The resin body 18 can be released from between both molds 1, 2 by the upper and lower ejector plates 22, 12 as shown in FIG. 14.

A resin tablet 17 supplied into pot 9, is subjected to heating and an expanding effect by heaters 5, 6, 11, 21 inside the pot 9 the top of which is opened.

The resin tablet 17 is heated at its bottom portion and around its peripheral portion, so that it expands upwardly from its upper surface side inside the pot 9 to be brought into a permeable state between its inside and outside.

Accordingly, air and moisture enclosed inside the resin tablet 17 can easily escape to the atmosphere.

When the molds are completely clamped together and hence closed, the forced exhaustion effect in the sealed space portion 38 is maintained by the vacuum source 40, whereby air and moisture inside the resin tablet is efficiently and effectively absorbed and exhausted to the atmosphere through the air vent 43 from the sealed space portion 38.

According to the present embodiment, when the upper and lower mold sections 1, 2 are intermediately clamped and when they are completely clamped, the air and moisture remaining inside the sealed space portion 38 in both mold sections 1, 2 and the air and moisture included inside resin tablet 17 can be surely and efficiently exhausted to the atmosphere, so that contaminations of the air and moisture into the melted resin material are prevented, whereby the formation of voids and defective portions are also prevented. The result is a high quality, highly reliable product.

The present embodiment also has an excellent and practical effect in that the total procedure and apparatus have been simplified to enhance the workability and operability.

In the second embodiment, until molding of the resin seal has been completed, the intermediate mold clamping step shown in FIG. 12 and the complete mold clamping step shown in FIG. 13 of the upper mold section 1 and of the lower mold 2 are performed. In each of the mold clamping steps, the remaining air and moisture in the outside air excluded space portion are absorbed and exhausted by vacuum source 40 to remove effectively air and moisture included in resin tablet 17. When the molds are clamped together completely, an air vent 43 is provided between the molding surfaces of the upper mold section 1 and the lower mold section 2.

Figure 19:
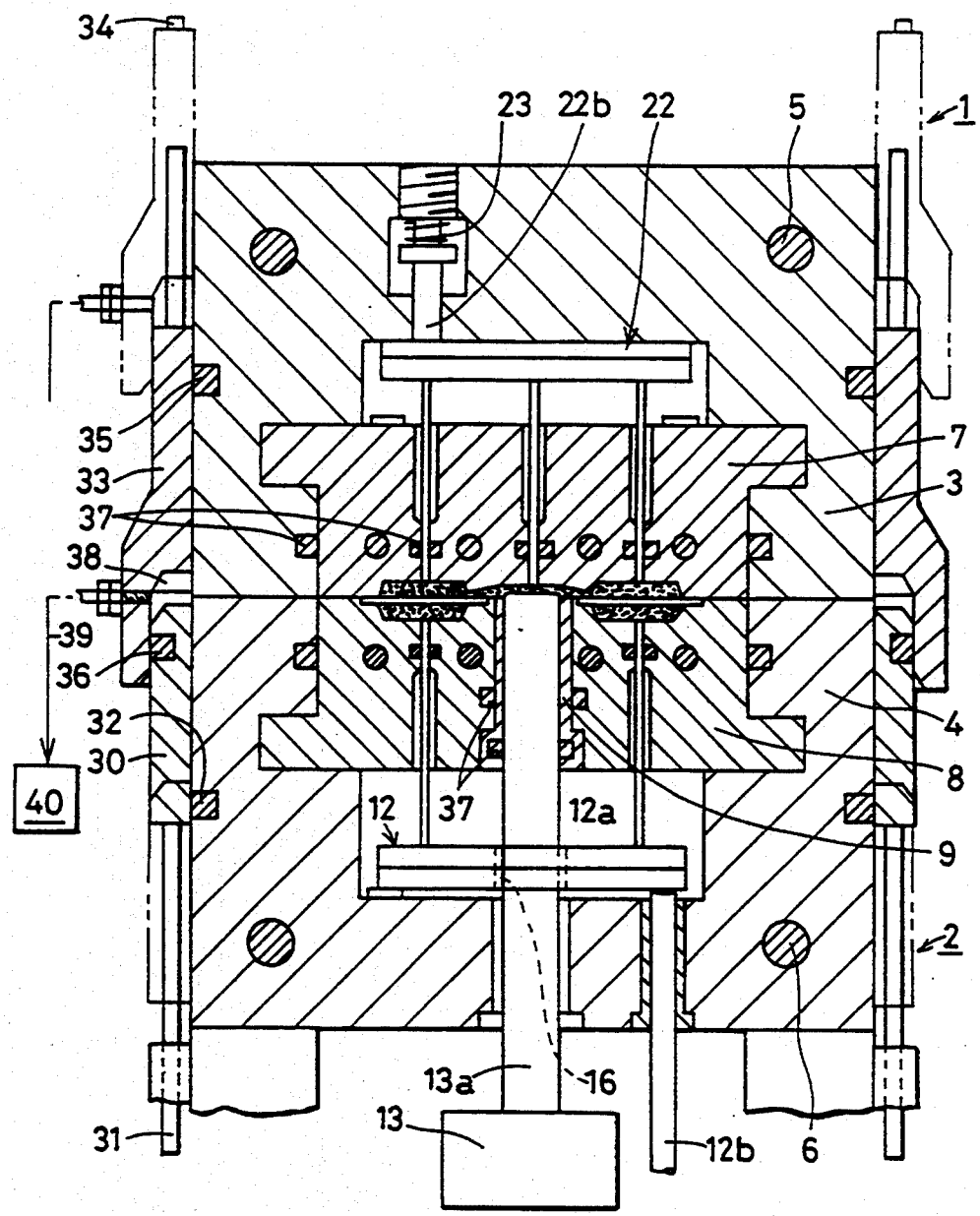
FIG. 19 is a partial broken longitudinal section illustrating a main portion in the complete mold clamped or closed state in the case where the apparatus shown in FIG. 10 does not have an air vent.

However, practice of the present method is not limited to such a structure, and the present method can be performed while starting from the mold open state shown in FIG. 11 to the complete mold clamping state shown in FIG. 19 without the intermediate mold clamping state. In this case using only the complete mold clamping state, it is also possible to use an apparatus in which the volume of air vent 43 as shown in FIG. 13 is extremely small, or air vent 43 is not formed at all. FIG. 19 shows a complete mold clamping state without the air vent 43. In such a case, when there is a gap between the molding surfaces immediately before the complete mold clamping state in which the molding surface of the upper mold section 1 and of the lower mold section 2 are close in contact, it is necessary to sufficiently absorb and exhaust air and moisture included in resin tablet 17 by the vacuum source 40.

Although the present invention has been described and illustrated in detail, it is clearly understood that the same is by way of illustration and example only and is not to be taken by way of limitation, the spirit and scope of the present invention being limited only by the terms of the appended claim.

What is claimed is:

1. A method for sealing an electronic part by molding resin around said electronic part, in a mold having an upper mold section and a lower mold section to enclose a mold cavity, at least one resin melting pot, means for pressurizing a resin tablet in said resin melting pot, a resin flow path from said resin melting pot to said mold cavity, and a gas exhaust path from said resin melting pot through said mold cavity to an evacuation pump, comprising the following steps:
   (a) placing an unpreheated resin tablet having room temperature into said resin melting pot and placing said electronic part into said mold cavity, whereby preheating said resin tablet outside said pot is avoided,
   (b) preheating said resin tablet directly in said resin melting pot,
   (c) sealing said upper and lower mold sections relative to each other for excluding outside air from a sealed space including at least said resin melting pot, said mold cavity, and said resin flow path,
   (d) further heating said resin tablet in said resin melting pot for expanding said resin tablet to freely release air and moisture from said resin tablet in said resin melting pot while said outside air exclusion is maintained by said sealing step,
   (e) completely clamping closed said upper and lower mold sections to each other while maintaining said sealing step,
   (f) evacuating said sealed space while maintaining said exclusion of outside air, and
   (g) applying pressure to said resin tablet in said resin melting pot for forcing melted resin into said mold cavity around said electronic part while continuing said evacuating step at least partly during said pressure applying, whereby air and moisture are evacuated.

2. The method of claim 1, further comprising performing, prior to said step (e), an intermediate clamping operation of said upper and lower mold sections for leaving an evacuation gap between facing surfaces of said upper and lower mold sections.

3. The method of claim 2, comprising evacuating said evacuation gap between said facing surfaces of said upper and lower mold sections in said step of performing said intermediate clamping operation of said upper and lower mold sections.

4. The method of claim 1, wherein said step of evacuating withdraws air and moisture from said sealed space including said resin melting pot, said mold cavity, and said resin flow path, thereby also removing air and moisture from inside said resin tablet while heating and expanding said resin tablet.

5. The method of claim 1, wherein said step of evacuating withdraws air and moisture from said sealed space including said resin melting pot, said mold cavity and said resin flow path, thereby also removing air and moisture from inside said resin tablet after it has been heated and expanded and during said step of applying pressure for forcing the melted resin into said mold cavities.

6. The method of claim 1, wherein said resin tablet has a weight of about seven grams or less.

7. A method for sealing an electronic part by molding resin around said electronic part, comprising the following steps:
   (a) placing an unpreheated resin tablet having room temperature into a pot of a mold and placing said electronic part into a mold cavity of said mold and closing said mold, whereby preheating said resin tablet outside said pot is avoided,
   (b) forming a sealed space between first and second sections of said mold, said sealed space including a gap between facing mold plane surfaces of said first and second mold sections, prior to completely closing said mold by moving said facing mold plane surfaces into contact with each other, and further comprising evacuating said gap,
   (c) heating said tablet from room temperature directly in said pot for expanding and melting said tablet in said pot while simultaneously evacuating said mold, whereby an evacuating flow removes air and moisture from said mold including air and moisture liberated from inside said resin tablet by said heating of said resin tablet, and
   (d) continuing said evacuating while pressurizing melted resin for injecting said melted resin into said mold cavity, and then curing said resin for encapsulating said electronic part in said mold.

8. The method of claim 7, wherein said heating step applies heat to a bottom and to lateral sides of said resin tablet for expanding said resin tablet only upwardly in said pot which confines said resin tablet at a tablet bottom and at tablet sides and permits expansion upwardly.

9. The method of claim 7, wherein said resin tablet has a weight of about seven grams or less.

10. The method of claim 7, wherein said evacuating takes place simultaneously with said heating and pressurizing.

11. The method of claim 7, wherein said pot is arranged centrally between a plurality of said mold cavities and wherein said evacuating flow must pass from said pot radially outwardly through said mold cavities.

12. The method of claim 7, wherein said evacuating is continued until said curing is at least substantially completed.

* * * * *